(12) United States Patent
Oodate et al.

(10) Patent No.: US 7,549,086 B2
(45) Date of Patent: Jun. 16, 2009

(54) MEMORY CARD AND ITS INITIAL SETTING METHOD

(75) Inventors: Hidefumi Oodate, Kodaira (JP); Atsushi Shiraishi, Kodaira (JP); Shigeo Kurakata, Kawagoe (JP); Kunihiro Katayama, Chigasaki (JP); Motoki Kanamori, Tachikawa (JP)

(73) Assignees: Renesas Technology Corp., Tokyo (JP); Hitachi ULSI Sytems Co., Ltd., Tokyo (JP)

( * ) Notice: Subject to any disclaimer, the term of this patent is extended or adjusted under 35 U.S.C. 154(b) by 0 days.

(21) Appl. No.: 11/877,500

(22) Filed: Oct. 23, 2007

(65) Prior Publication Data

US 2008/0059852 A1     Mar. 6, 2008

Related U.S. Application Data

(63) Continuation of application No. 10/484,043, filed as application No. PCT/JP02/04460 on May 8, 2002, now Pat. No. 7,305,589.

(30) Foreign Application Priority Data

Sep. 13, 2001     (JP) .............................. 2001-278138

(51) Int. Cl.
    *G06F 11/00*     (2006.01)
(52) U.S. Cl. ........................... 714/36; 714/719
(58) Field of Classification Search ................. 714/36, 714/719
    See application file for complete search history.

(56) References Cited

U.S. PATENT DOCUMENTS

| | | | |
|---|---|---|---|
| 4,414,665 A | 11/1983 | Kimura et al. | 714/719 |
| 4,631,724 A | 12/1986 | Shimizu | 714/718 |
| 4,760,575 A | 7/1988 | Watanabe | 714/719 |
| 5,568,608 A | 10/1996 | Shannon | 714/44 |
| 5,831,460 A * | 11/1998 | Zhou | 327/143 |

(Continued)

FOREIGN PATENT DOCUMENTS

JP     61-278992     12/1986

(Continued)

OTHER PUBLICATIONS

Oshima, M. (ed.), "IC Card with Expanding Applications. Latest Technology Trends in IC Cards" (Electronic Materials), Industrial Investigation Association Co., Ltd., Dec. 1, 1990, pp. 22-26 (with English translation).

*Primary Examiner*—Joshua A Lohn
(74) *Attorney, Agent, or Firm*—Miles & Stockbridge P.C.

(57) ABSTRACT

In the initial setting of a memory card 1, the flash check data FD stored in a flash memory 2 is read out, this data FD is compared with the operation check data $FD1_1$ stored previously in the ROM, the write check data $FD1_2$ stored in the ROM 4a is written, if a fault is not detected, to the flash memory 2, and this data is read again and is compared with the write check data. $FD1_2$ of the ROM 4a. When any fault is not detected in comparison of these data, the CPU determines that the flash memory 2 is normal. Moreover, if a fault is detected in the comparison of data, the CPU sets the reset process fault data to a register 5a to set a controller 3 to the sleep mode. When the command CMD is received during this period, data comparison is executed again.

6 Claims, 5 Drawing Sheets

U.S. PATENT DOCUMENTS

| | | | |
|---|---|---|---|
| 5,883,532 A * | 3/1999 | Bowers | 327/143 |
| 6,229,751 B1 | 5/2001 | Kutaragi et al. | 365/229 |
| 6,647,521 B2 | 11/2003 | Matsui | 714/719 |
| 6,823,485 B1 | 11/2004 | Muranaka | 714/719 |
| 7,310,760 B1 * | 12/2007 | Sun et al. | 714/745 |
| 2001/0052093 A1 | 12/2001 | Oshima et al. | 714/719 |

FOREIGN PATENT DOCUMENTS

| | | |
|---|---|---|
| JP | 8-129629 | 5/1996 |
| JP | 08-129631 A | 5/1996 |

* cited by examiner

MEMORY CARD AND ITS INITIAL SETTING METHOD

CROSS-REFERENCE TO RELATED APPLICATION

This application is a continuation of application Ser. No. 10/484,043 filed Mar. 5, 2004 now U.S. Pat. No. 7,305,589, which is a 371 of PCT/JP02/04460 filed May 8, 2002.

TECHNICAL FIELD

The present invention relates to a memory card and particularly to the technology which can be effectively applied for stable operation of a multimedia card.

BACKGROUND ART

As a medium of external storage media such as a personal computer and a multi-function terminal, a multimedia card standardized by the MMCA (MultiMedia Card Association) as the standardization organization is widely known. This multimedia card is used for storing still-pictures of digital cameras, data of a mobile telephone and music of a mobile music player or the like.

A multimedia card is formed of a flash memory and a controller for controlling the same flash memory. The controller is also provided with a power supply voltage detection circuit. This power supply voltage detection circuit detects the rising edge of the power supply voltage supplied from a host machine to thereby perform resetting.

According to investigation by the inventors, the multimedia card is subjected to the so-called power on reset process for initialization of the same card in order to stabilize operation when the power supply voltage is supplied.

This power-on reset process is performed to check whether the flash memory is ready for operation or not, by making access to the flash memory from the controller to read the data in the system region such as CID (Card Identification number register)/CSD (Card Specific Data register) after the power supply voltage detection circuit resets the controller by detecting the rising edge of the power supply voltage supplied from the host machine.

As an example of the document describing details of an IC card of this type, the "Electronic Materials" P22 to P26 edited by Masashi Ohshima and issued by Industrial Investigation Association Co., Ltd. on Dec. 1, 1990 may be listed. This document also describes technical trend of various IC cards.

However, the inventors of the present invention have found problems in the power-on reset processing technology for the memory card as described above.

In general, the operation voltage of the flash memory is set higher than the operation voltage of the controller and therefore here rises possibility that the flash memory does not reach the operation voltage when the controller makes access to the flash memory.

Accordingly, a problem may be assumed to occur in which the flash memory does not operate normally when the controller makes access to the flash memory, the data of the system region such as CID/CSD cannot be read successfully, the controller enters the condition in which the controller cannot accept the commands at all from the host machine, and thereby the host machine can no longer recognize the multimedia card.

An object of the present invention is to provide a memory card which can remarkably improve reliability by surely conducting the power-on reset process even if the power supply voltage supplied is unstable, and to provide a method of initializing the same memory card.

The aforementioned and the other objects and the novel features of the present invention will become apparent from the description of the present specification and the accompanying drawings.

DISCLOSURE OF THE INVENTION

The memory card of the present invention comprises: a nonvolatile semiconductor memory for storing the operation check data in a certain storage area; and a control part which includes a storage unit for storing the operation check data for comparison to compare the operation check data of the nonvolatile semiconductor memory, and processing device for comparing the operation check data of nonvolatile semiconductor memory with the operation check data for comparison of the storage unit and then performing operation check of the nonvolatile semiconductor memory.

Moreover, summary of the other inventions of the present specification will be briefly described below.

1. The operation check data is stored in a certain storage area of a nonvolatile semiconductor memory, a control part is provided with a processing unit to perform the predetermined processes on the basis of a control program, a nonvolatile storage unit storing the control program, a volatile storage unit for temporarily storing input/output data and arithmetic operation data, and an interface logic unit for inputting and outputting various commands and data inputted or outputted to or from external side, the operation check data for comparison to be compared with the operation check data read from the nonvolatile semiconductor memory is stored to the certain area of the nonvolatile storage area, and the processing unit compares the operation check data read from the nonvolatile semiconductor memory with the operation check data for comparison of the nonvolatile storage unit during the initializing operation, thereby performing check operations of the nonvolatile semiconductor memory.

2. In the item 1 described above, the write check data to be written into the nonvolatile semiconductor memory is stored to the nonvolatile storage unit, and the processing unit compares, in the initial setting operation, the operation check data of the nonvolatile semiconductor memory with the operation check data for comparison of the nonvolatile storage unit and reads the write check data written into the nonvolatile semiconductor memory, to check the operation of the nonvolatile semiconductor memory through comparison between the check data and the write check data of the nonvolatile storage unit.

3. In the item 1 or 2, the data storage unit for storing fault data is provided to an interface logic unit, and the processing unit sets the fault data to the data storage unit and interrupts the initial setting operation thereby setting the control part to the sleep mode when a failure is detected in the comparison between the operation check data of the nonvolatile semiconductor memory and operation check data for comparison of the nonvolatile storage unit or in the comparison between the write check data written into the nonvolatile semiconductor memory and the write check data of the nonvolatile storage unit, and the processing unit also executes the initial setting operation upon receiving a setting command to check the end of initial setting from an external side during the period for setting the fault data to the data storage unit.

Moreover, summary of the other inventions of the present specification will be briefly itemized below in detail.

1. Initial setting method of memory card including the following steps of:

(a) reading, upon receiving the setting command for requesting the initial setting from the external side, the operation check data previously stored in the nonvolatile semiconductor memory, and comparing the read check data with the operation check data for comparison of the nonvolatile storage unit;

(b) setting, when a failure is detected in the data compared, the fault data to the data storage unit upon determination that a failure exists in the nonvolatile semiconductor memory, and intermitting the initial setting operation to set the control part to the sleep mode;

(c) comparing, during the period for setting the fault data to the data storage unit, the operation check data of the nonvolatile semiconductor memory with the operation check data for comparison of the nonvolatile storage unit until these are matched for every receiving of the setting command for checking the end of initial setting operation from the external side, and clearing the fault data being set to the data storage unit when these data are matched.

2. Initial setting method of memory card including the following steps of:

(a) reading, upon receiving the setting command requesting for the initial setting from the external side, the operation check data which has been stored previously to a certain storage area of the nonvolatile semiconductor memory, and comparing the operation check data read from the nonvolatile semiconductor memory with the operation check data for comparison of the nonvolatile storage unit;

(b) writing the write check data stored in the nonvolatile storage unit to the nonvolatile semiconductor memory;

(c) reading the write check data stored in the nonvolatile semiconductor memory, and comparing the write check data obtained with the write check data of the nonvolatile storage unit;

(d) setting, when a failure is detected in any one of the operation check data of the nonvolatile semiconductor memory compared and the operation check data for comparison of the nonvolatile storage unit, or any one of the write check data of the nonvolatile semiconductor memory and the write check data of the nonvolatile storage unit, the fault data to the data storage unit upon determination that a failure exists within the nonvolatile semiconductor memory, and also setting the control part to the sleep mode by intermitting the initial setting operation;

(e) every time the setting command for checking the end of the initial setting operation is received from the external side during the period for setting the fault data to the data storage unit, comparing the operation check data of the nonvolatile semiconductor memory, write check data, operation check data for comparison of the nonvolatile storage unit and write check data until these are matched, and then clearing the fault data being set to the data storage unit when these data are matched.

BEST MODE FOR CARRYING OUT THE INVENTION

Details of the present invention will be described with reference to the accompanying drawings. The like elements are designated with the like reference numerals throughout the accompanied drawings and the same descriptions are eliminated.

Figure 1:
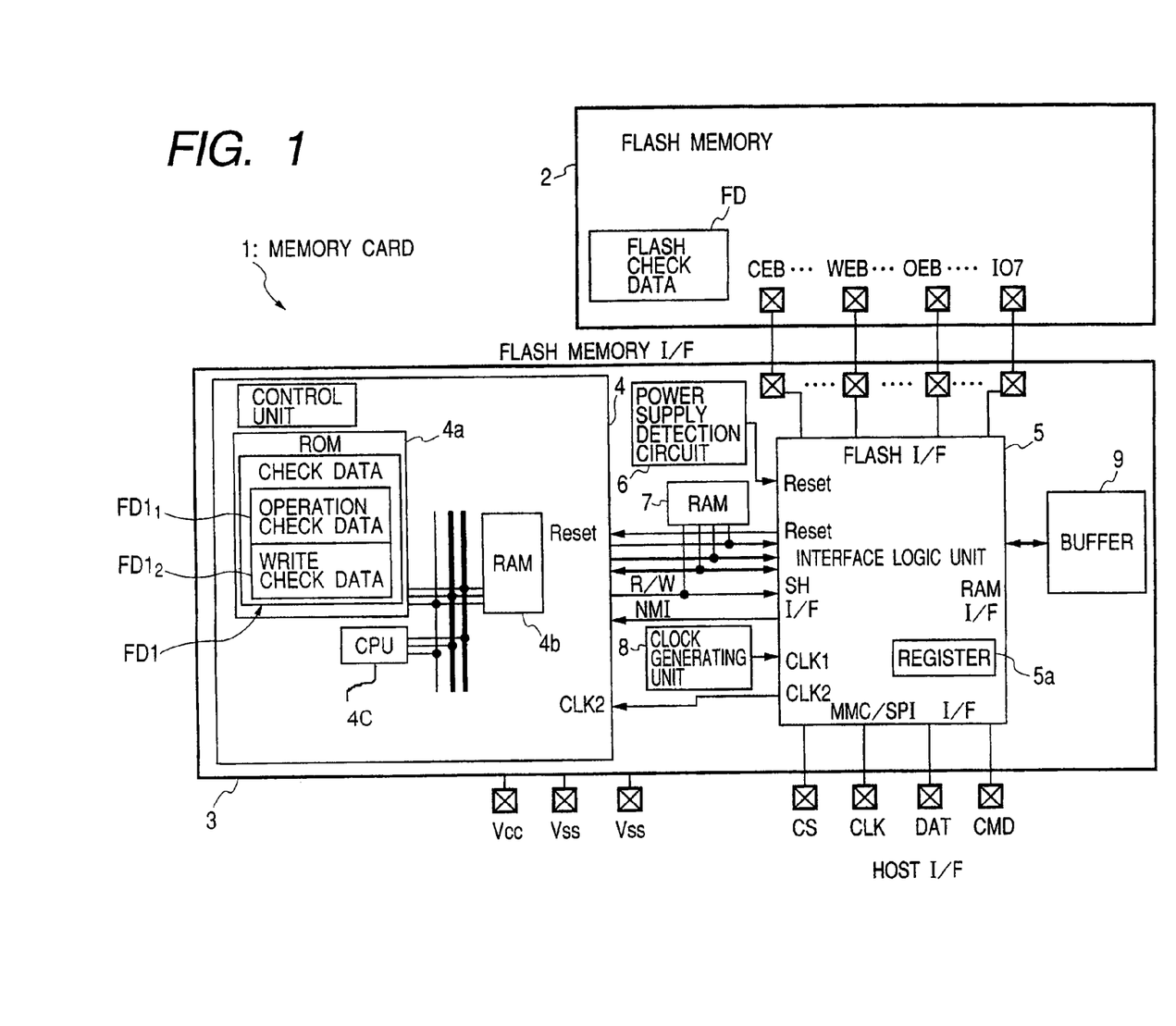
FIG. 1 is a block diagram of a memory card depending on the first embodiment of the present invention.

In the preferred embodiment of the present invention, a memory card 1 is formed of a multimedia card which may be used as an external storage medium of a host machine in digital video camera, mobile telephone set, mobile music player and personal computer or the like.

The memory card 1 is provided with a flash memory (nonvolatile semiconductor memory) 2 and a controller 3. The flash memory 2 is formed as an electrically erasable and programmable nonvolatile semiconductor memory.

This flash memory 2 previously stores the flash check data (operation check data) FD for checking, when the power is on, whether the flash memory 2 is in the normally operating condition or not.

The controller 3 controls the flash memory 2 to perform the predetermined processes by reading programs and data stored in the flash memory 2 and to issue the instruction for data write operation.

This controller 3 is formed of a control unit (control means) 4, an interface logic unit 5, a power supply detection circuit 6, a RAM 7, a clock generating unit 8 and a buffer 9 or the like.

The control unit 4 controls the controller 3 completely. This control unit 4 is provided with a ROM (storage unit, nonvolatile storage unit) 4$a$, a RAM (volatile storage unit) 4$b$ and a CPU (processing unit) 4$c$.

The ROM 4$a$ is formed of a read-only memory or the like, and stores the control programs for operating the CPU 4$c$ and the check data FD1. The check data FD1 stored in this ROM 4$a$ includes the operation check data (operation check data for comparison) FD1$_1$ consisting of the data which is identical to the flash check data FD stored in the flash memory 2 and the write check data FD1$_2$ which is written to the flash memory 2 during the power-on reset process (initial setting).

The RAM 4$b$ is a random access memory which allows the read and write operations whenever required, and temporarily stores the input/output data and arithmetic data or the like. The CPU 4$c$ performs the predetermined processes on the basis of the control programs of the ROM 4$a$.

The interface logic unit 5 receives the commands to instruct the operations such as write, read and erase operations inputted or outputted to or from the host machine and inputs or outputs the data required for these operations.

This interface logic unit 5 is provided with a register (data storage unit) 5$a$ for setting the reset process fault data (fault data), if the initial setting of the memory card 1 is not completed normally at power turning on.

The power supply detection circuit 6 detects rise of the power supply voltage VCC when the power is turned on and outputs the reset signal to the interface logic unit 5.

The RAM 7 is a random access memory which allows the read and write operations whenever required and is used as the work area of the control unit 4. The clock generating unit 8 generates the clock signal of the selected frequency and then supplies this clock signal to the interface logic unit 5. The buffer 9 temporarily stores the data inputted and outputted to and from the host machine and flash memory 2.

Next, the power-on reset process in the memory card 1 of this embodiment will be described with reference to the flowchart of FIG. 2.

First, when the memory card 1 is inserted into a memory slot or the like, the power supply voltage VCC is supplied to the memory card 1 via connector terminals of the memory slot.

The power supply detection circuit 6 of the memory card 1 outputs the reset signal to the interface logic unit 5 when the power supply voltage VCC at power turning on reaches the predetermined voltage level, and the reset of the interface logic unit 5 is released (step S101), thereby executing the initialization (step S102).

Thereafter, the host machine outputs the command (setting command) CMD (command index CMD1' SEND_OP_COND' sorted to the command class 0) which is used to check the range of voltage in which the memory card 1 can be operated and to check whether the memory card 1 has completed the internal processes or not (step S103).

When the power supply voltage VCC reaches the predetermined voltage level (operation voltage of the control unit 4), the power supply detection circuit 6 outputs the detection signal to the interface logic unit 5 having completed the initialization. The interface logic unit 5 outputs the reset signal to the control unit 4.

The control unit 4 executes the initialization of the CPU 4a when the reset signal outputted from the interface logic unit 5 and the command CMD outputted from the host machine are inputted thereto.

The control unit 4 also initializes all registers provided thereto (step S104) and thereafter initializes the register of the interface logic unit 5 used for the read/write operations by the control unit (S105).

Subsequently, the control unit 4 initializes internal variables used in the firmware (step S106) and respectively checks the number of chips and capacity of the flash memory 2 (step S107).

Moreover, the controller 3 makes access to the flash memory 2 to determine whether the flash memory 2 is ready for read/write operations or not (step S108).

As the process in this step S108, the controller 3 reads the flash check data FD stored in the flash memory 2 by making access to the flash memory 2.

The CPU 4c compares the flash check data FD read from the flash memory 2 with the operation check data $FD1_1$ stored previously in the ROM 3a, and the CPU 4c determines that the flash memory 2 is ready for the read operation when these flash check data FD and operation check data $FD1_1$ are matched.

When the flash memory 2 is ready for the read operation, the CPU 4c writes the write check data $FD1_2$ stored in the ROM 4a to the flash memory 2 and then reads again the write check data $FD1_2$ written to the flash memory 2 and compares the write check data $FD1_2$ obtained with the write check data $FD1_1$ of the ROM 4a.

When the write check data $FD1_2$ written to the flash memory 2 is matched with the write check data $FD1_2$ of the ROM 4a, the CPU 4c determines that the flash memory 2 is operating normally.

With such data comparison, highly reliable operation check of the flash memory can be performed.

Thereafter, the CPU 4c checks whether the firmware for additional alteration is stored in the flash memory 2 or not and performs so-called firm-on flash read operation for reading the firmware when the firmware for additional alteration is stored in the flash memory 2 (step S109).

Moreover, the controller 3 respectively reads the CID/CSD stored in the system area of the flash memory 2 (step S110).

The CID is a serial number assigned to the memory card 1 and is used to assign the relative address for selecting the memory card 1.

The CSD is the data indicating various information pieces related to the memory card 1 such as corresponding MMCA specification version, card capacity, access time and transfer unit block length.

The control unit 4 reads and writes data of the buffer 9 for testing the buffer 9 (step S111). Thereafter, the control unit 4 generates a table of the alternative registration blocks of the defective sector and registers this table to the RAM 7 or the like (step S112). Moreover, it is also possible to skip the process of the step S111 for reducing the time required for the processes.

Thereafter, it is checked whether the password or the write-protect area exists in the memory card 1 or not by reading the password and write-protect data, and the result is then registered to the RAM 7 (step S113).

Accordingly, the power-on reset operation for initially setting the memory card 1 is completed. Moreover, when an error is generated in the processes in the steps S108 to S112, the CPU 4c sets the reset process fault data (Lo level) to the register 5a of the interface logic unit 5 (step S114) and thereafter the controller 3 enters the sleep mode (step S115).

During this sleep mode, namely when the command CMD is outputted from the host machine while the reset process fault data (here, Lo level) is set to the register 5a (step S116), the interface logic unit 5 outputs the reset signal to the controller 3 to execute again the processes of the steps S104 to S112.

When no error is detected in the processes of the steps S104 to S112, the power-on reset operation of the memory card 1 is completed after the process of the steps S113.

Moreover, when an error is generated again in the processes of the steps S104 to S112, the processes of the steps S114 to S116 are executed. The processes of the steps S104 to S112 and steps S114 to S116 are repeated until an error is no longer generated.

Next, the power-on reset process in the memory card 1 will be described with reference to the transition diagram of voltage level of the power supply voltage VCC supplied from the host machine of FIG. 3 and the diagram illustrating transition of conditions of each unit in the power-on reset process of FIG. 4. Here, completion of the initial setting operation of the memory card 1 with the second power-on reset process will be described.

Figure 4:
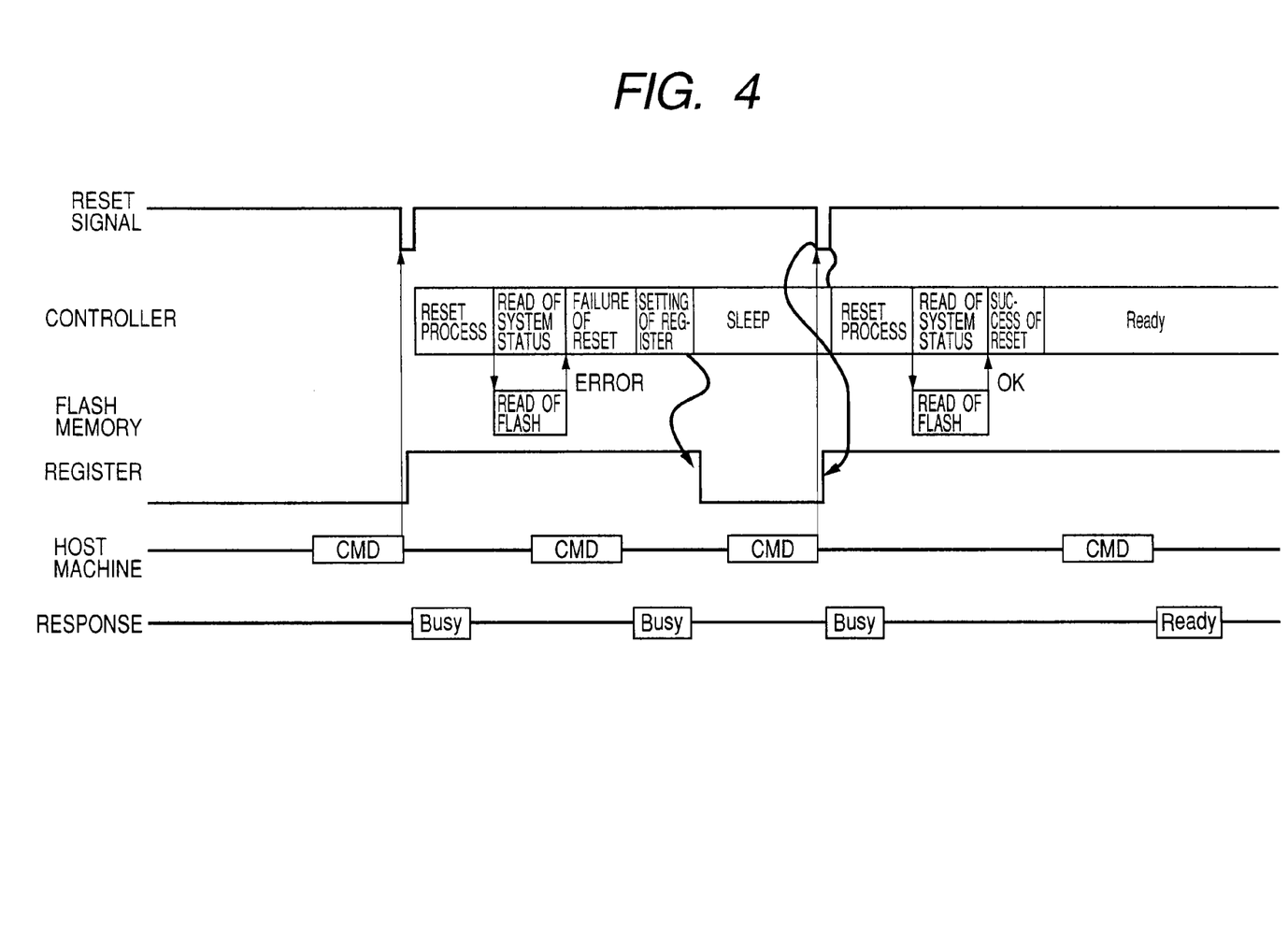
FIG. 4 is a diagram illustrating transition of each unit in the power-on reset process of the memory card of FIG. 1.

In FIG. 4, transitions in the reset signal inputted to the controller 3, operations of controller 3, operations of flash memory 2, setting conditions of the register 5a of the interface logic unit 5, command outputted from the host machine, and response of format specified for each command returned to the host machine from the memory card 1 are respectively indicated from the lower side to the upper side.

First, when the memory card 1 is inserted into the memory slot of the host machine, the interface logic unit 5 reaches the voltage enough for operation and the interface logic unit 5 is initialized, the host machine outputs the commands to check the voltage range enough for operation of the memory card 1 and to check whether the internal process of the memory card 1 has been completed or not.

Upon reception of this command CMD, the interface logic unit 5 returns the "Busy" response to the host machine and also outputs the reset signal to the controller 3. Moreover, the interface logic unit 5 sets the Hi level signal to the register 5a.

In addition, the command CMD is repeatedly outputted from the host machine in every predetermined period from the "Busy" response until the "Ready" response is returned.

Moreover, the controller 3 executes the reset process by receiving the reset signal of the interface logic unit 5. This reset process corresponds to the processes in the steps S104 to S107 in FIG. 2.

Thereafter, the controller 3 executes the system status read process by making access to the flash memory 2. Here, the system status read process corresponds to the processes in the steps S108 to S113 in FIG. 2.

Figure 3:
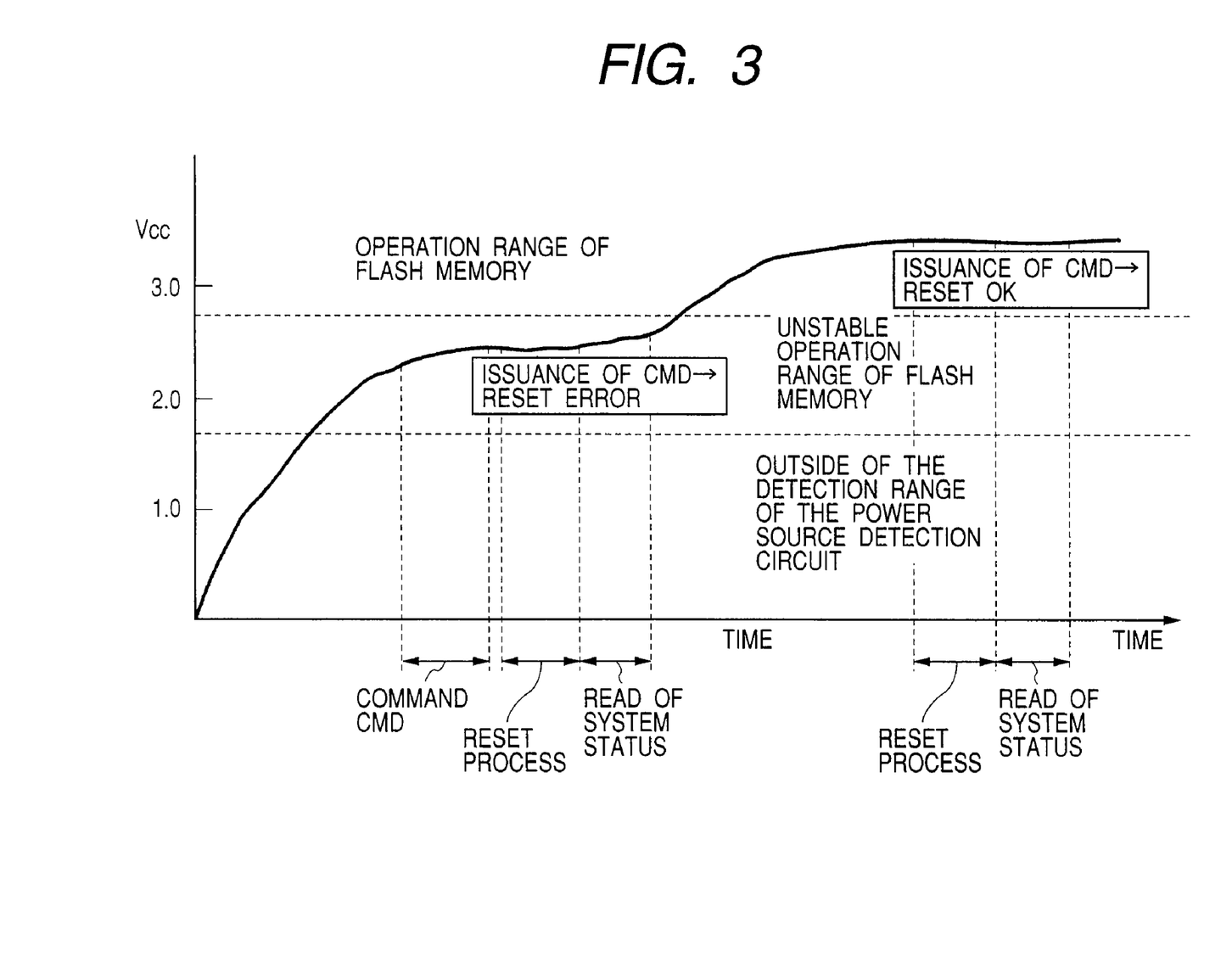
FIG. 3 a transition diagram of power supply voltage supplied to the memory card of FIG. 1.

During the period of this system status read process, the power supply voltage VCC does not yet reach the range of operation voltage of the flash memory 2 and in the unstable voltage range as illustrated in FIG. 3. Accordingly, an error is generated in the system status read process, disabling the reset.

With occurrence of this fault, the CPU 4c sets the reset process fault data to the register 5a of the interface logic unit 5 and the controller 3 enters the sleep mode.

When the controller 3 receives the command CMD from the host machine during this sleep mode, the interface logic unit 5 returns again the "Busy" response to the host machine, outputs the reset signal to the controller 3, and sets the register 5a to the Hi level.

Figure 2:
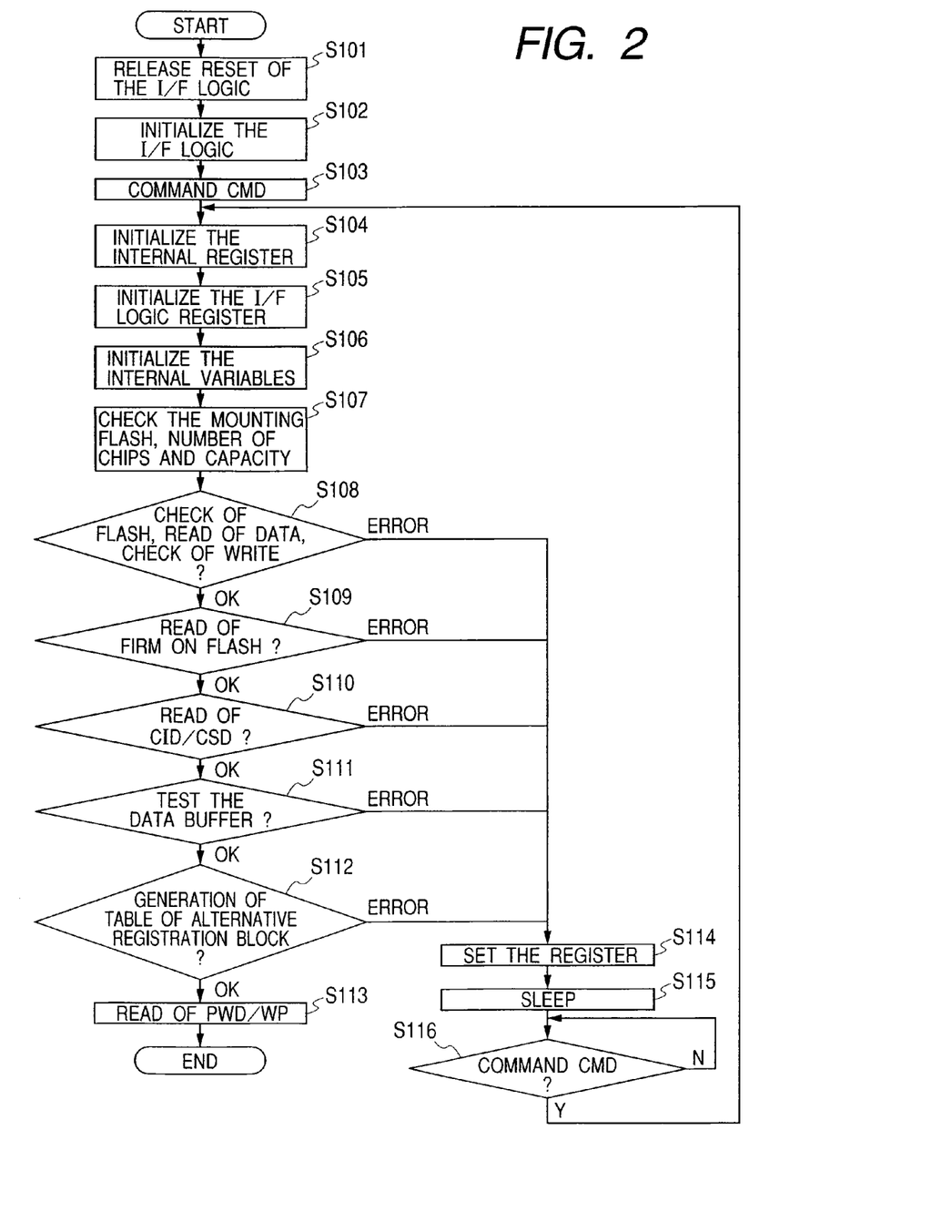
FIG. 2 is a flowchart of the power-on reset process in the memory card of FIG. 1.

The controller 3, which has received the reset signal of the interface logic unit 5, performs the reset process in the steps S104 to S107 (FIG. 2). After the end of this reset process, the controller 3 makes access to the flash memory 2 to execute the system status read process in the steps S108 to S113 (FIG. 2).

Since the power supply voltage VCC reaches the operation voltage of the flash memory 2 as illustrated in FIG. 3 during the period of the second system status read process, the system status read process is executed without generation of any error and the power-on reset process is completed successfully.

Accordingly, the memory card 1 is set to the initial condition and when the third command CMD is inputted from the host machine, the controller 3 returns the "Ready" response to the host machine.

Therefore, the memory card 1 repeats retry until the power-on reset process is successfully completed and flexibility can be improved by making unnecessary the cutoff operation of the power supply voltage VCC and retry with a user.

Figure 5:
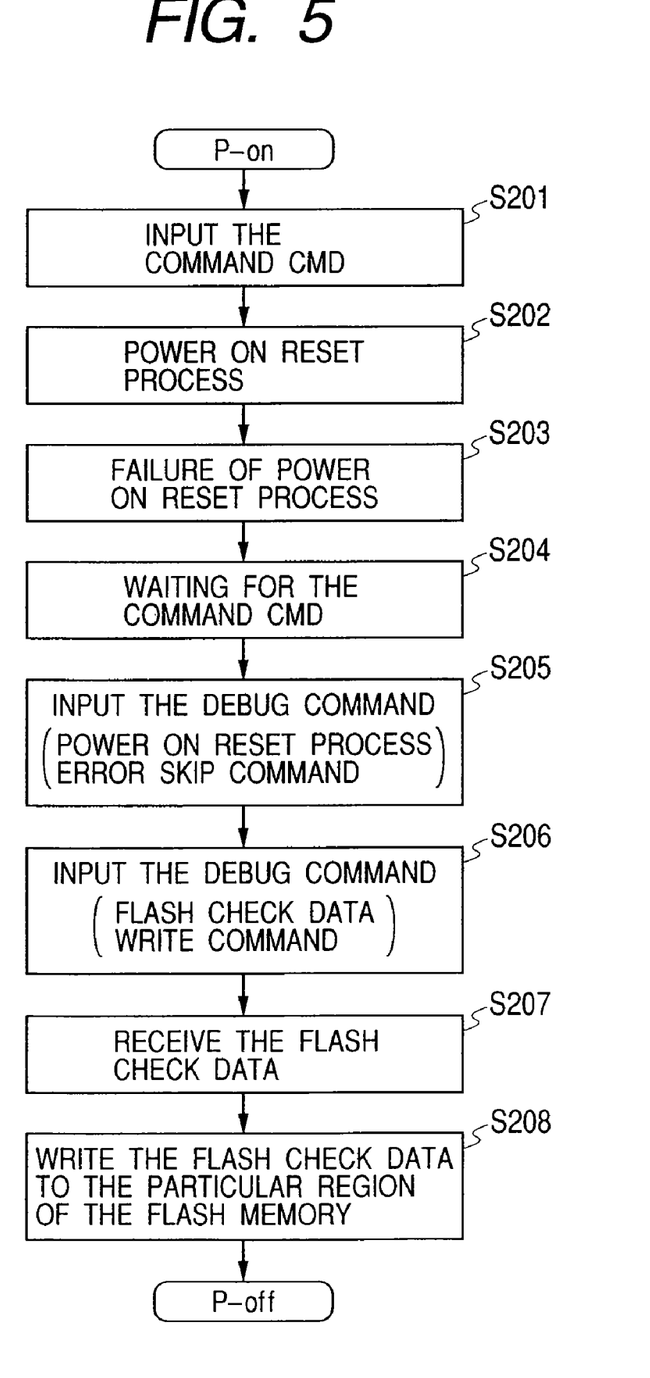
FIG. 5 is a flowchart for writing the flash check data to a flash memory provided in the memory card of FIG. 1.

Here, write of the flash check data FD in the flash memory 2 will be described with reference to the flowchart of FIG. 5. This flash check data FD is written in the selection process before delivery of the memory card 1.

First, when the memory card 1 is mounted to the host machine such as an emulator and the power supply voltage VCC is supplied thereto, the command CMD is inputted from the host machine (step S201), and the memory card 1 executes the power-on reset process (step S202).

In this case, since the data such as flash check data FD, CID/CSD, password and write protect are not written to the flash memory 2, the power-on reset process fails (step S203), and the memory card 1 waits for input of the command CMD from the host machine (step S204).

The host machine issues the power-on reset process skip command which is one of the debug commands for skipping the power-on reset process (step S205) and thereby the memory card 1 is shifted to the condition where the power-on reset process is completed normally.

The debug command is prepared for a card vendor to rewrite the system information of the memory card 1 and to analyze a fault thereof. During the transfer to the debug mode, the power-on reset process can be skipped.

Thereafter, the host machine also issues the flash check data write command which is one of the debug commands (step S206) and transmits the flash check data FD to the memory card 1.

When the memory card 1 receives the flash check data FD from the host machine (step S207), the flash check data FD is written to a certain area in the flash memory 2 (step S208).

Moreover, the data such as CID/CSD, password and write protect are also written into a certain area in the flash memory 2 as in the case of the steps S207 to S209.

Therefore, according to the embodiment of the present invention, since the memory card 1 can be set to the initial condition even if the power supply voltage VCC supplied from the host machine is unstable, reliability of the memory card 1 can be improved remarkably.

Moreover, in this embodiment, the power-on reset process is repeatedly executed until the memory card 1 can be set successfully to the initial condition. However, it is also possible to limit the number of times of the power-on reset process when the setting to the initial condition fails.

In this case, it is assumed that the register 5a of the interface logic unit 5 is provided with a plurality of execution number setting bits to set the number of times of execution of the power-on reset process in addition to the bits for setting the reset process fault data.

Moreover, data is set to the execution number setting bits whenever the setting of the initial condition fails and when all bits are set, namely setting of the initial condition in the desired number of times fails, the power-on reset process is not executed even when the command CMD is requested from the host machine.

In addition, it is also possible, when the first power-on reset process fails, that the reset processes in the steps S104 to S107 (FIG. 2) are skipped from the second power-on reset process, and the process is started from the system status read processes in the steps S108 to S113 (FIG. 3).

Even in this case, the register 5a also has the bits for skip data for setting the skip data in addition to the bits for setting the reset process fault data, and sets the bits for skip data when the first power-on reset process fails.

When the bits for skip data are set, the interface logic unit 5 skips the reset processes in the steps S104 to S107 during the second and subsequent power-on reset processes and starts the process from the system status read processes in the steps S108 to S113 (FIG. 2).

Accordingly, the time required for power-on reset process when the retry is executed can be shortened.

The present invention proposed by the inventors has been described practically on the basis of the preferred embodiment but the present invention is never limited only to the embodiment described above and allows various changes and modifications within the scope of the invention.

For example, in the embodiment, the check data for checking the read/write operations of the flash memory has been previously stored in the ROM but it is also possible to provide a structure that the check data is outputted from the host machine in accompaniment to the commands outputted from the host machine.

INDUSTRIAL APPLICABILITY

As described above, the memory card and the method for initial setting of the same of the present invention is suitable for stable operation technology in a multimedia card.

What is claimed is:

1. A memory card capable of connecting to an external circuit, comprising:

a controller; and a nonvolatile semiconductor memory, wherein an operation voltage and a command are received from said external circuit, wherein said controller includes a determination circuit, and wherein said determination circuit repeats a determination operation in response to receiving a predetermined command when a determination that said nonvolatile semiconductor memory is not ready for performing an operation is made because the operation voltage supplied from said external circuit is insufficient to read data from or to write data to said nonvolatile semiconductor memory in an initial setting operation when power begins to be supplied from a power supply or in a power on reset operation.

2. The memory card according to claim 1, wherein said controller includes a storage unit and stores, to said storage unit, information indicating that said nonvolatile semiconductor memory is determined not ready for performing said operation with said determination circuit.

3. The memory card according to claim 1, wherein the determination is made by accessing said nonvolatile semiconductor memory in said determination operation.

4. The memory card according to claim 3, wherein said controller includes a storage unit and stores, to said storage unit, information indicating that said nonvolatile semiconductor memory is determined not ready for performing said operation with said determination circuit.

5. The memory card according to claim 3, wherein, in said determination operation, the determination is made based on data obtained by reading predetermined data from said nonvolatile semiconductor memory.

6. The memory card according to claim 5, wherein said controller includes a storage unit and stores, to said storage unit, information indicating that said nonvolatile semiconductor memory is determined not ready for performing said operation with said determination circuit.

* * * * *